United States Patent
Ohno et al.

(10) Patent No.: US 8,217,477 B2
(45) Date of Patent: Jul. 10, 2012

(54) MAGNETIC MEMORY CELL AND MAGNETIC RANDOM ACCESS MEMORY

(75) Inventors: Hideo Ohno, Sendai (JP); Shoji Ikeda, Sendai (JP); Jun Hayakawa, Hino (JP)

(73) Assignees: Hitachi, Ltd., Tokyo (JP); Tohoku University, Miyagi (JP)

( * ) Notice: Subject to any disclaimer, the term of this patent is extended or adjusted under 35 U.S.C. 154(b) by 0 days.

(21) Appl. No.: 12/318,243

(22) Filed: Dec. 23, 2008

(65) Prior Publication Data

US 2009/0166773 A1  Jul. 2, 2009

(30) Foreign Application Priority Data

Dec. 28, 2007  (JP) ................................ 2007-338525

(51) Int. Cl.
  *H01L 29/82* (2006.01)
(52) U.S. Cl. ................. 257/421; 257/E29.323; 365/158
(58) Field of Classification Search .................. 257/414, 257/421, E29.323; 438/3, 48, 49; 365/158, 365/171; 360/324.1; 428/811.2
  See application file for complete search history.

(56) References Cited

U.S. PATENT DOCUMENTS

| | | | |
|---|---|---|---|
| 5,695,864 | A | 12/1997 | Slonczewski |
| 2002/0141231 | A1 | 10/2002 | Komori |
| 2003/0179510 | A1 | 9/2003 | Hayakawa |
| 2005/0184839 | A1 | 8/2005 | Nguyen et al. |
| 2007/0258281 | A1 | 11/2007 | Ito et al. |
| 2008/0310216 | A1 | 12/2008 | Miura |

FOREIGN PATENT DOCUMENTS

| | | |
|---|---|---|
| JP | 2002-305337 | 12/2001 |
| JP | 2002-299584 | 10/2002 |
| JP | 2003-281705 | 10/2003 |
| JP | 2006-278645 | 10/2006 |
| JP | 2007-525839 | 9/2007 |
| JP | 2007-300079 | 11/2007 |
| JP | 2008-311321 | 12/2008 |
| WO | WO 2005/079528 A2 | 9/2005 |

OTHER PUBLICATIONS

English translation of JP2006278645.*
Office Action from Japanese Patent Office for Japanese Patent Application 2007-338525 dated Apr. 13, 2010.
T. Miyazaki et al., "Giant Magnetic Tunneling Effect in Fe/Al$_2$O$_3$/Fe Junction", Journal of Magnetism and Magnetic Materials, Letters to the Editor, vol. 139, 1995, pp. L231-L234.

(Continued)

*Primary Examiner* — Ben P Sandvik
*Assistant Examiner* — Whitney T Moore
(74) *Attorney, Agent, or Firm* — Stites & Harbison, PLLC; Juan Carlos A. Marquez, Esq.

(57) ABSTRACT

Provided is a reliable nonvolatile memory with a lower power consumption. A ferromagnetic interconnection which is magnetized antiparallel or parallel to a magnetization direction of a ferromagnetic pinned layer in a giant magnetoresistive device or a tunnel magnetoresistive device constituting the magnetic memory cell, is connected to a ferromagnetic free layer with a non-magnetic layer being interposed in between, the ferromagnetic free layer serving as a recording layer. Thereby, the magnetization of the recording layer is switched by use of a spin transfer torque.

9 Claims, 19 Drawing Sheets

OTHER PUBLICATIONS

Shinji Yuasa et al., "Giant Room-Temperature Magnetoresistance in Single-Crystal Fe/MgO/Fe Magnetic Tunnel Junctions", Nature Materials, Letters, vol. 3, Dec. 2004, pp. 868-871.

A. A. Tulapurkar et al., "Subnanosecond Magnetization Reversal in Magnetic Nanopillars by Spin Angular Momentum Transfer", Applied Physics Letters, vol. 85, No. 22, Nov. 29, 2004, pp. 5358-5360.

Office Action issued by the Japanese Patent Office on Mar. 15, 2011 in the corresponding Japanese Patent Application No. 2007-338525.

* cited by examiner

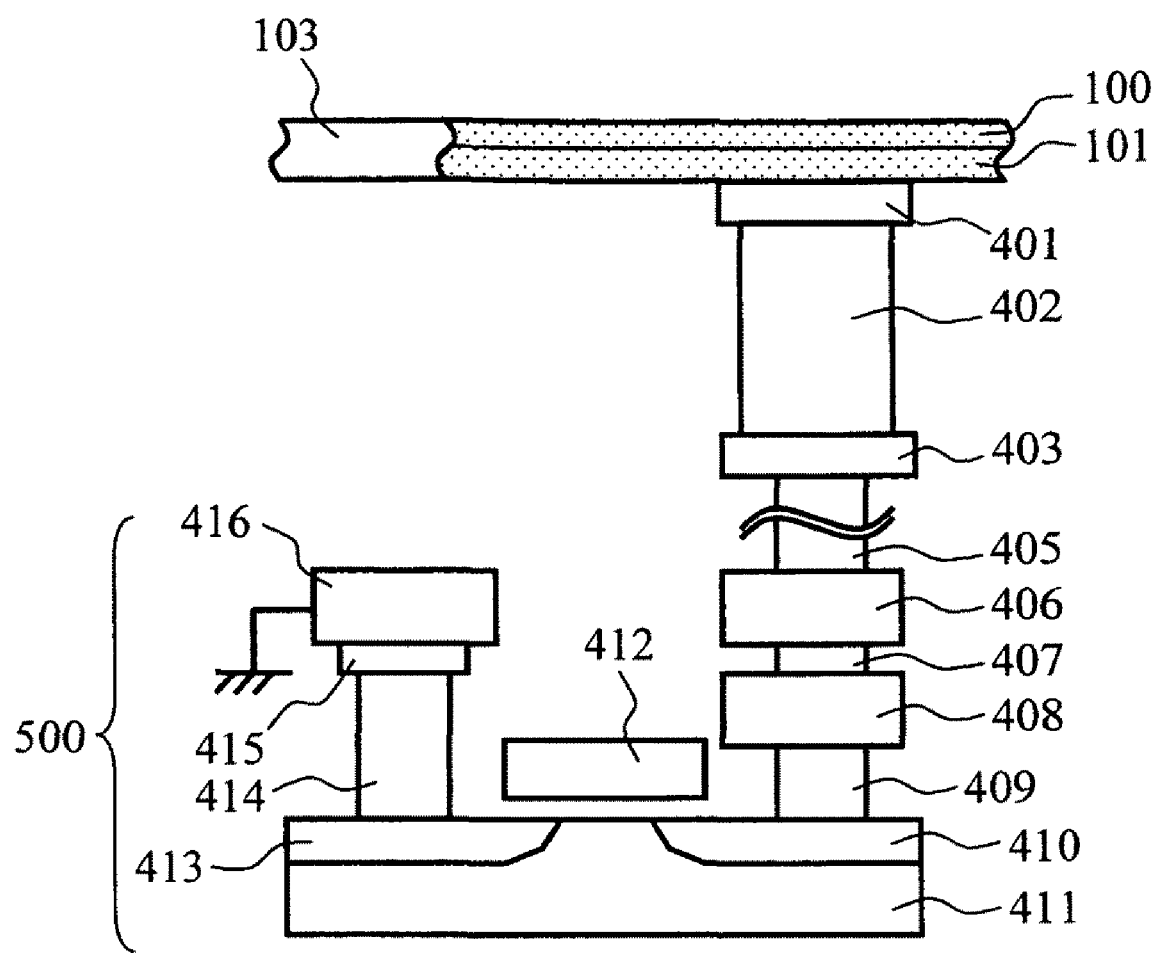

FIG. 15A
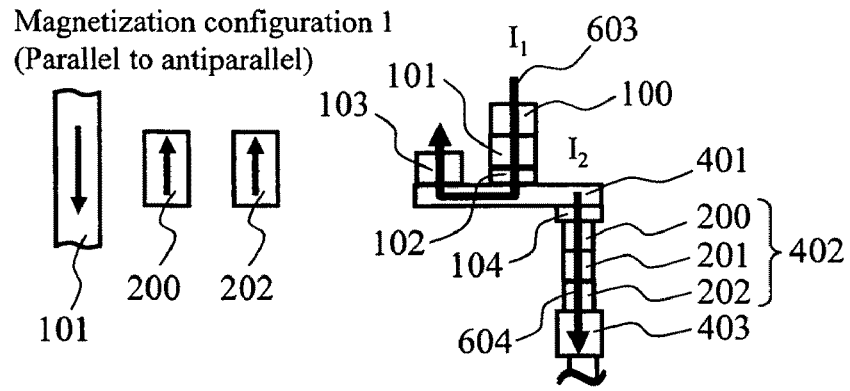
FIG. 15B
Example of controlling write current 1
FIG. 15C
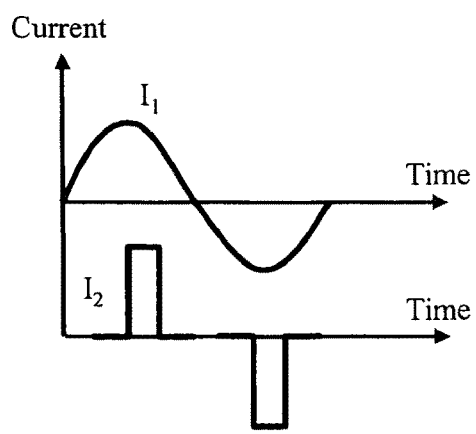
Example of controlling write current 2

Magnetization configuration 2
(Antiparallel to parallel)

Example of controlling write current 1

Example of controlling write current 2

FIG. 19

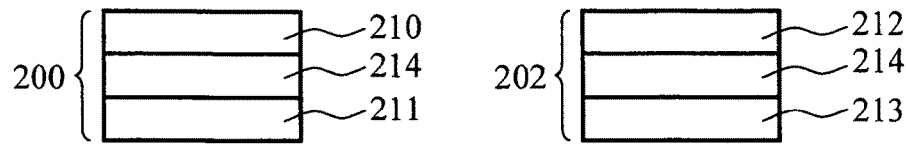

| First Ferromagnetic Film 210, Third ferromagnetic film 212 | Second Ferromagnetic Film 211, Fourth ferromagnetic film 213 |
|---|---|
| [Co(100-x)Fe(x)](100-y)B(y) 0<x<100 (%), 0<y<30 (%) (CoFeB alloy: including CoB or FeB) | [Co(100-x)Fe(x)](100-y)B(y) |
| | Co(100-x)Fe(x) |
| | NiFe |
| | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| Co(100-x)Fe(x) (Co, Fe alloy: including Co or Fe) 0<x<100 (%) | [Co(100-x)Fe(x)](100-y)B(y) |
| | Co(100-x)Fe(x) |
| | NiFe |
| | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| NiFe | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |
| [Co(100-x)Fe(x)](100-y)B(y)/Co(100-x)Fe(x) Two-layered ferromagnetic layer 0<x<100 (%), 0<y<30 (%) | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |
| [Co(100-x)Fe(x)](100-y)B(y)/NiFe Two-layered ferromagnetic layer 0<x<100 (%), 0<y<30 (%) | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |
| Co(100-x)Fe(x)/NiFe Two-layered ferromagnetic layer 0<x<100 (%), 0<y<30 (%) | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |

…

MAGNETIC MEMORY CELL AND MAGNETIC RANDOM ACCESS MEMORY

CLAIM OF PRIORITY

The present application claims priority from Japanese patent application JP 2007-338525 filed on Dec. 28, 2007, the content of which is hereby incorporated by reference into this application.

BACKGROUND OF THE INVENTION

1. Field of the Invention

The present invention relates to a magnetic memory cell and a magnetic random access memory each on which a magnetoresistive device is mounted.

2. Description of the Related Art

An attempt has been made on the application of a tunnel magnetoresistive device with a large output to recording/reproducing cells in a high density magnetic memory. For such tunnel magnetoresistive device, a tunnel magnetoresistive device including an insulator for which an Al oxide is used and a tunnel magnetoresistive device including an insulating film for which magnesium oxide is used, have been disclosed (T. Miyazaki and N. Tezuka, J. Magn. Magn. Mater. 139, L231 (1995); and S. Yuasa, et al., Nature Material 3, 868(2004)). A conventional nonvolatile magnetic memory is formed of memory cells each in which a tunnel magnetoresistive device is formed on a MOSFET (metal oxide semiconductor field effect transistor). The conventional type of nonvolatile magnetic memory employs a scheme in which: a MOSFET is used as a switching element in each memory cell; information is written in the memory cell by rotating the magnetization direction of the tunnel magnetoresistive device by use of a current-induced spatial magnetic field generated by energizing the bit line and the word line; and the information is read from the memory cell by use of an output voltage from the tunnel magnetoresistive device. In addition to the scheme of the magnetization rotation by use of the current-induced spatial magnetic field, there is also employed what is termed as a spin transfer torque magnetization switching scheme in which the magnetization direction of a magnetoresistive device is switched by applying a current to the magnetoresistive device directly. This technique is disclosed, for example, in U.S. Pat. No. 5,695,864 and in Japanese Patent Application Publication No. 2002-305337.

SUMMARY OF THE INVENTION

In the write method using the spin transfer torque magnetization switching scheme, it is known that, when information is written in a memory within a time period not longer than 10 nanoseconds which is a write operation time generally needed, a critical current which causes the magnetization switching by the spin transfer torque is increased to a large extent, and additionally the magnetization is wrongly switched. FIG. 20A is a plot showing relationships between write currents and switching probabilities are plotted. The diagram is cited from Appl. Phys. Lett. 85, 5358-5360 (2004). This diagram shows that the switching probability is not equal to 0 or 1 in some time regions, and that a value representing a write current for making the switching probability equal to 1 becomes extremely large in a short write time region. FIG. 20B is a diagram showing a relationship between magnitudes of the write current and write times. FIG. 20B shows that the write current is large when the write time is not longer than 10 nanoseconds. FIG. 20C is a diagram in which relationships between write probabilities and write currents are plotted. FIG. 20C shows that the write probability is not equal to 0 or 1 in some current regions (not smaller than $I_1$, but not larger than $I_2$).

In general, information needs to be written in the magnetic memory within a time period not longer than 10 nanoseconds. In order to realize a reliable high density nonvolatile memory with lower power consumption, the magnetization of the recording layer in the tunnel magnetoresistive device needs to be securely switched within such a short time period with a low current without error.

An object of the present invention is to provide a magnetic memory cell and a magnetic random access memory which are capable of meeting these needs.

The present invention causes a ferromagnetic interconnection which is magnetized at a predetermined angle to a magnetization direction of a ferromagnetic pinned layer to be connected to a ferromagnetic free layer as a recording layer with a non-magnetic layer being interposed in between in each giant magnetoresistive device or tunnel magnetoresistive device constituting a magnetic memory cell. Thus, the present invention causes the magnetization direction of the recording layer to be switched by use of a spin transfer torque. In addition, the present invention causes each giant magnetoresistive device or tunnel magnetoresistive device to include a non-magnetic interconnection which is connected to the non-magnetic layer in separation from the ferromagnetic interconnection, and to further include a means for causing a current to flow to the ferromagnetic interconnection and the non-magnetic interconnection through the non-magnetic layer. Thus, the present invention causes the giant magnetoresistive device or tunnel magnetoresistive device to switch the magnetization direction of the recording layer by use of the spin transfer torque by applying an appropriate current pulse signal or a high-frequency current.

The magnetic memory cell according to the present invention includes: a magnetoresistive device including a first non-magnetic film, a ferromagnetic free layer and a ferromagnetic pinned layer, the ferromagnetic free layer and the ferromagnetic pinned layer being formed with a first non-magnetic layer interposed in between; an electrode for causing a current to flow in the magnetoresistive device in its thickness direction; a second non-magnetic layer connected to the ferromagnetic free layer; and a ferromagnetic interconnection connected to the second non-magnetic layer. In the magnetic memory cell according to the present invention, information is written in the magnetic memory cell by causing a current to flow in the magnetoresistive device so that a spin transfer torque switches a magnetization of the ferromagnetic free layer.

The magnetic memory cell according to a first aspect of the present invention causes a current to flow in the magnetoresistive device through the ferromagnetic interconnection. The magnetic memory cell according to a second aspect includes a non-magnetic interconnection connected to the second non-magnetic layer, and means for causing a current to flow between the non-magnetic interconnection and the ferromagnetic interconnection.

In a case where the ferromagnetic free layer is configured of a single-layered ferromagnetic film, it is desirable that the magnetization direction of the ferromagnetic interconnection be antiparallel to the magnetization direction of the ferromagnetic pinned layer. In addition, in a case where the ferromagnetic free layer is a laminated film having a synthetic ferrimagnetic structure, it is desirable that the magnetization direction of the ferromagnetic interconnection be parallel to the magnetization direction of the ferromagnetic pinned layer.

A magnetic random access memory according to the present invention includes: a magnetic memory cell group in which magnetic memory cells are arranged in a two-dimensional array. Each magnetic memory cell includes a magnetoresistive device formed of a ferromagnetic free layer and a ferromagnetic pinned layer which are formed with a first non-magnetic film interposed in between; and an electrode for causing a current to flow in the magnetoresistive device in its thickness direction. The magnetic random access memory also includes selecting means for selecting a desired magnetic memory cell out of the magnetic memory cell group; and multiple ferromagnetic interconnections arranged in each row of magnetic memory cells constituting the two-dimensional array in a way to be parallel to a magnetization easy axis direction commonly of multiple ferromagnetic free layers respectively included in the magnetic memory cells belonging to the row. In the magnetic random access memory, the ferromagnetic interconnection are each connected to the ferromagnetic free layers of the plurality of magnetic memory cells belonging to each raw with second non-magnetic layers interposed in between, respectively. The magnetic random access memory causes a current to flow in one magnetic memory cell selected by the selecting means, and thereby writes information in the magnetic memory cell by switching the magnetization of the ferromagnetic free layer of the magnetoresistive device included in the one magnetic memory cell by use of a spin transfer torque.

The magnetic random access memory according to a first aspect of the invention causes a current to flow in each magnetoresistive device through the corresponding ferromagnetic interconnection. The magnetic random access memory according to a second aspect of the invention further includes: a non-magnetic interconnection arranged in parallel to the ferromagnetic interconnections, and connected to the second non-magnetic layers; and means for causing a current to flow between the non-magnetic interconnection and the ferromagnetic interconnection.

The present invention is capable of reducing write currents for the spin transfer torque, and concurrently of reducing the write error rate, as well as consequently capable of realizing the reliable nonvolatile memory with lower power consumption.

BRIEF DESCRIPTION OF THE DRAWINGS

FIG. 8 is a schematic diagram showing a fourth configuration example of the magnetic memory cell according to the present invention.

FIGS. 15A, 15B and 15C are diagrams showing a relationship between write currents and the respective write timings.

FIG. 19 is a table showing examples of a material used for each of a ferromagnetic free layer and the ferromagnetic pinned layer.

DETAILED DESCRIPTION OF THE PREFERRED EMBODIMENT

Figure 1:
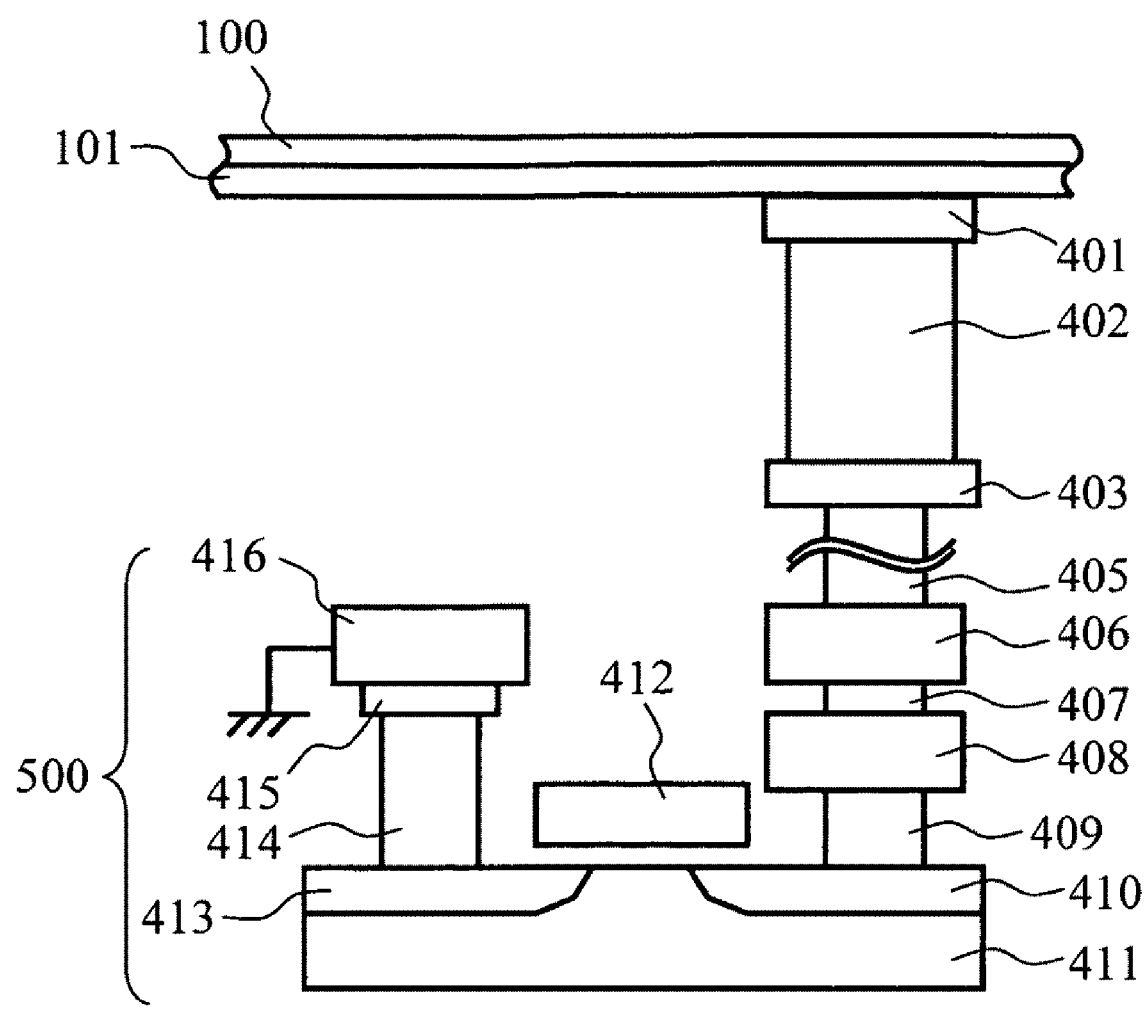
FIG. 1 is a schematic diagram showing a first configuration example of a magnetic memory cell according to the present invention.

Descriptions will be provided hereinafter for the embodiment of the present invention by referring to the drawings. Descriptions of the present invention will be given hereinbelow by using an example where a tunnel magnetoresistive device is used as the magnetoresistive device in a magnetic memory cell. Nevertheless, an alternative use of a giant magnetoresistive device can offer the same effect as using the tunnel magnetoresistive device.

FIG. 1 is a schematic drawing showing a first configuration example of a magnetic memory cell according to the present invention on which a tunnel magnetoresistive device is mounted. A C-MOS (complementary metal-oxide semiconductor) device 500 includes two n-semiconductors 410, 413 and a single p-semiconductor 411. A drain electrode 414 connected to the n-semiconductor 413 are grounded through electrodes 415 and 416. A source electrode 409 is connected to the n-semiconductor 410. The ON/OFF of a current flow between the source electrode 409 and the drain electrode 414 is controlled by ON/OFF action of a gate electrode 412. Electrodes 408 to 405 are sequentially laid on the source electrode 409. A tunnel magnetoresistive device 402 is connected to the source electrode 409 with an electrode 403 and the electrodes 408 to 405 being interposed in between. Electrodes may be additionally included between the electrode 405 and the electrode 403 to some extent. A non-magnetic layer 401 is connected to the tunnel magnetoresistive device 402. It is, however, desirable that a ferromagnetic free layer be directly connected to the non-magnetic layer 401.

The magnetic memory cell of the present invention further includes a ferromagnetic interconnection 101 connected to the non-magnetic layer 401. It is desirable that the ferromagnetic interconnection 101 constitutes a laminated interconnection, together with a bit line 100 of the magnetic memory cell. Nevertheless, the ferromagnetic interconnection 101 may be simply used as the bit line. A material such as CoFe, NiFe or CoFeB containing Co, Fe or Ni is used for the ferromagnetic interconnection 101. For write of information in the magnetic memory cell, a current for generating a spin transfer torque flows to the tunnel magnetoresistive device 402 between the non-magnetic layer 401 and the electrode 403, once the gate electrode 412 is turned on. The spin transfer torque is generated by applying a current to the tunnel magnetoresistive device 402 configured of a ferromagnetic free layer, an insulating barrier layer and a ferromagnetic pinned layer, and has an effect of switching the magnetization of the ferromagnetic free layer. Read of information is performed by detecting a tunnel magnetoresistive effect produced by a mutual angle between the magnetization directions of the ferromagnetic free layer and the ferromagnetic pinned layer.

Figure 2A:
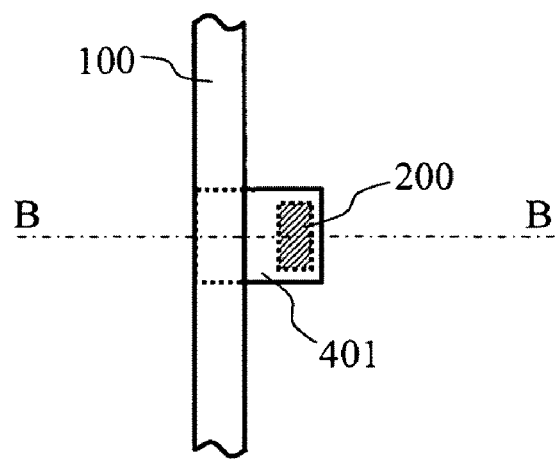
FIGS. 2A and 2B are pattern diagrams showing a chief section taken out of the magnetic memory cell shown in FIG. 1.
Figure 2B:
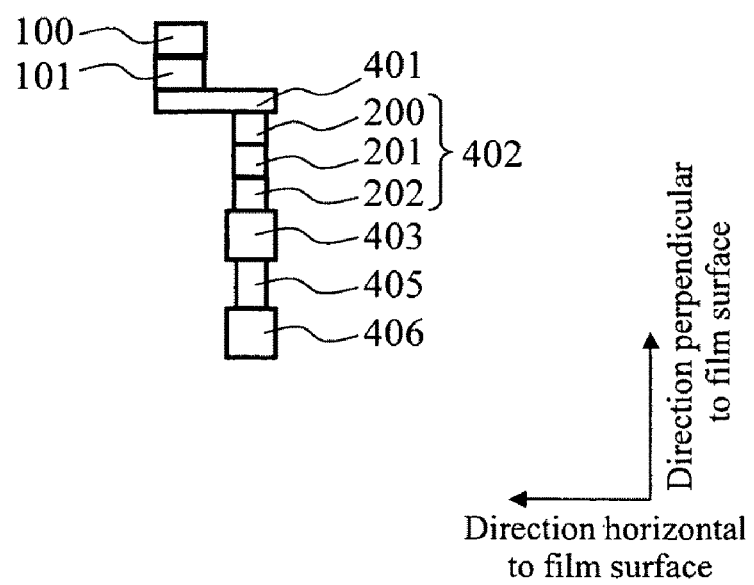

FIGS. 2A and 2B are pattern diagrams showing a chief section taken out of the magnetic memory cell shown in FIG. 1. FIG. 2A is a plan pattern diagram showing the chief section, and FIG. 2B is a cross-sectional pattern diagram showing the chief section taken along the IIB-IIB line of FIG. 2A. In the case of the magnetic memory cell shown in FIGS. 2A and 2B, the tunnel magnetoresistive device 402 including a ferromagnetic pinned layer 202, an insulating barrier layer 201 and a ferromagnetic free layer 200 is stacked on the electrode 403 having the electrodes 405 and 406 thereunder. In addition, the non-magnetic layer 401 is formed on the ferromagnetic free layer 200, and the ferromagnetic interconnection 101 is connected to the non-magnetic layer 401.

Figure 17A:
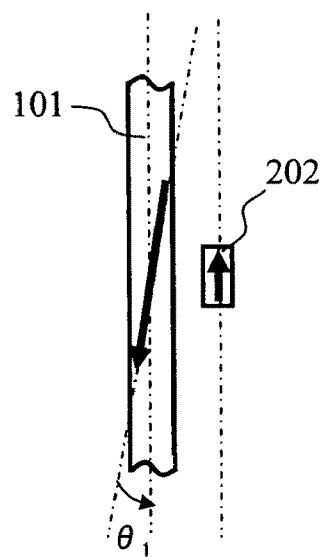
FIGS. 17A and 17B are diagrams each showing an example of how a magnetization of a ferromagnetic interconnection and a magnetization of a ferromagnetic pinned layer are arranged to each other.
Figure 17B:
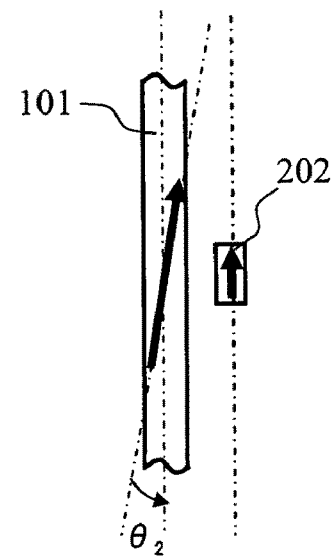

Now, by referring to FIG. 17A, descriptions will be provided for magnetization directions of the ferromagnetic interconnection 101 and the ferromagnetic pinned layer 202 in the case where the ferromagnetic free layer 200 is formed of a single-layered ferromagnetic film. $\theta_1$ shown in FIG. 17A denotes an angle between the magnetization directions of the ferromagnetic interconnection 101 and the ferromagnetic pinned layer 202. $\theta_1$ is defined as being equal to 0° when the magnetizations of the ferromagnetic interconnection 101 and the ferromagnetic pinned layer 202 are arranged antiparallel to each other. When $-90° \leqq \theta_1 \leqq 90°$, it is possible to reduce write currents by use of the spin transfer torque, and thereby to reduce a write error rate to a large extent. Particularly, when the magnetizations of the ferromagnetic interconnection 101 and the ferromagnetic pinned layer 202 are arranged to be $\theta_1 = 0$, it is possible to obtain the maximum reducing effect. Next, by referring to FIG. 17B, description will be provided for magnetization directions of the ferromagnetic interconnection 101 and the ferromagnetic pinned layer 202 in the case where the ferromagnetic free layer 200 has a synthetic ferrimagnetic structure. Here, $\theta_2$ shown in FIG. 17B denotes an angle between the magnetization directions of the ferromagnetic interconnection 101 and the ferromagnetic pinned layer 202. $\theta_2$ is defined as being equal to 0° when the magnetization of the ferromagnetic interconnection 101 and the ferromagnetic pinned layer 202 are arranged parallel to each other. In this case, when $-90° \leqq \theta_2 \leqq 90°$, it is possible to reduce the write currents by use of the spin transfer torque, and thereby to decrease a write error rate to a large extent. It is most desirable that the magnetizations of the ferromagnetic interconnection 101 and the ferromagnetic pinned layer 202 are arranged particularly in a way that $\theta_2$ is 0°. The synthetic ferrimagnetic structure herein is a structure which is formed of three layers including a ferromagnetic layer, a non-magnetic layer and another ferromagnetic layer, and in which the magnetizations of the respective two ferromagnetic layers are antiparallel to each other.

Figure 18A:
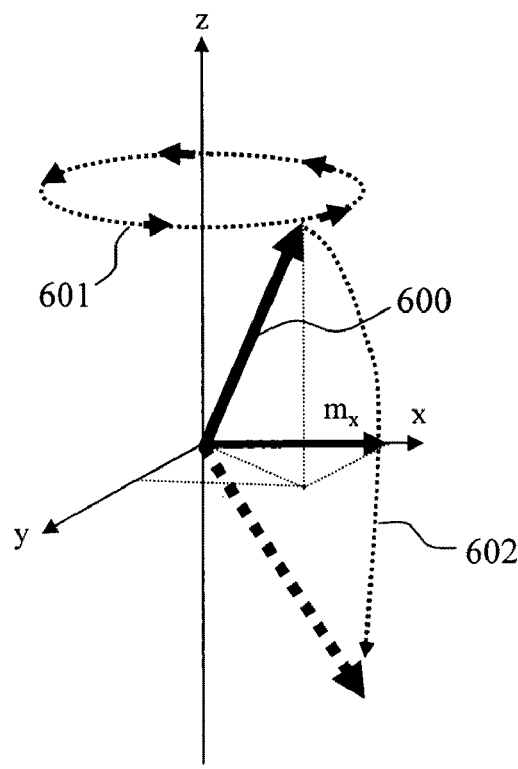
FIGS. 18A and 18B are diagrams used to explain a precession motion of a magnetization and timings at which currents are applied.
Figure 18B:
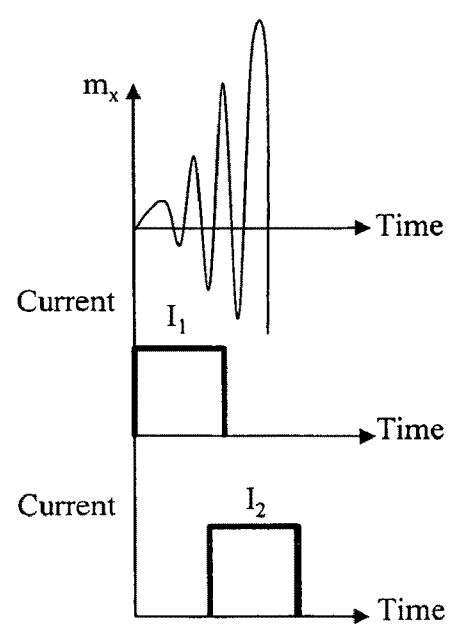
Figure 20A:
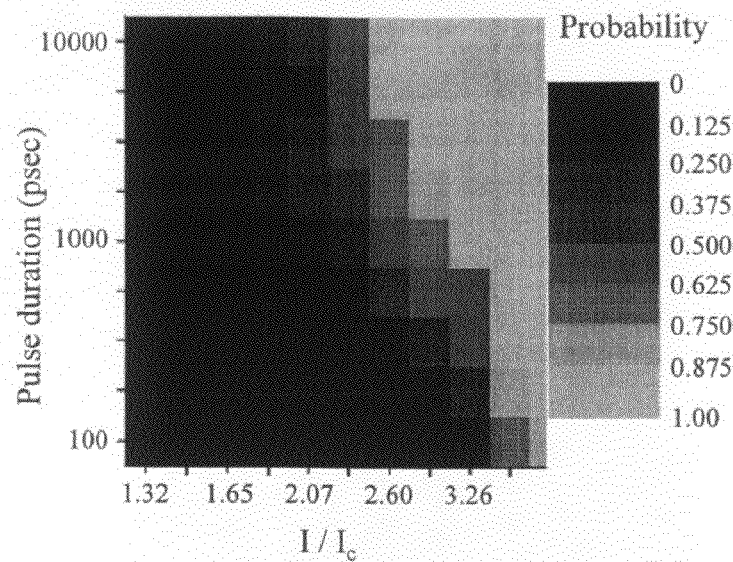
FIGS. 20A, 20B and 20C are diagrams used to explain a problem with a write method performed by switching a magnetization by use of a spin transfer torque.
Figure 20B:
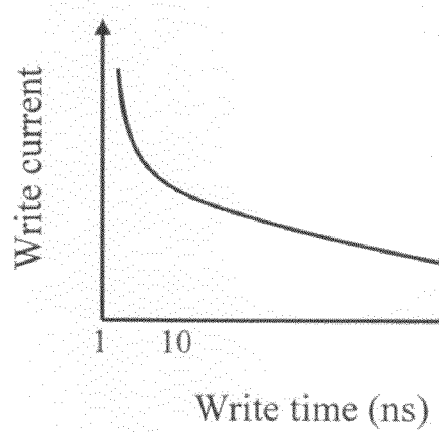
Figure 20C:
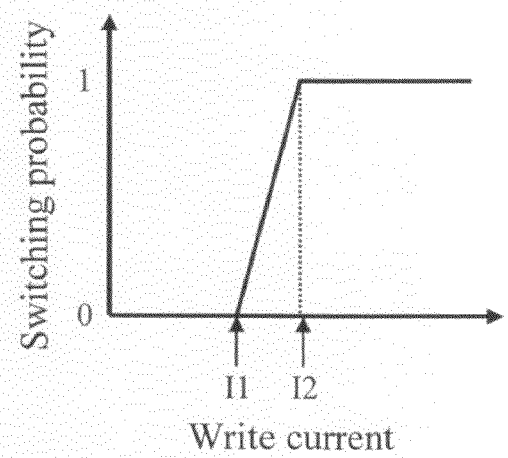

Here, by referring to FIGS. 18A and 18B, descriptions will be a reason why the present invention is capable of reducing the write currents through the magnetization of the ferromagnetic free layer by use of the spin transfer torque, and thereby to decrease the write error rate when the ferromagnetic interconnection is connected to the ferromagnetic free layer with the non-magnetic layer being interposed in between, and concurrently when an appropriate mutual angle is formed between the ferromagnetic interconnection and the ferromagnetic fixed layer. FIG. 18A shows an example of a precession motion of the magnetization of the ferromagnetic free layer. The z-axis shown in FIG. 18A denotes a magnetization easy axis of the ferromagnetic free layer. An arrow 600 denotes a magnetization vector of the ferromagnetic free layer. In general, in a case where the magnetization of the ferromagnetic free layer is switched by the spin transfer torque, immediately after an amount of current corresponding to a value representing a magnetization switching critical current is applied, the magnetization vector 600 of the ferromagnetic free layer starts to show a precession motion about the z-axis (the magnetization easy axis of the ferromagnetic free layer) along an orbit 601 as shown in FIG. 18A. Subsequently, the magnetization vector 600 is switched from the positive direction to the negative direction in the z-axis along an orbit 602. Nevertheless, if the amplitude and phase of an initial precession motion of the vector 600 of the ferromagnetic free layer is not unstable, it is likely that the vector 600 may not be able to process along the orbit 602, and accordingly that the vector 600 may not be able to be switched from the positive direction to the negative direction in the z-axis. The stabilization of the amplitude and phase of the initial precession motion of the vector 600 is probabilistic. In other words, the occurrence of the magnetization switching of the ferromagnetic free layer by the spin transfer torque becomes probabilistic.

With this taken into consideration, the present invention causes the ferromagnetic interconnection to be connected to the ferromagnetic free layer with the non-magnetic layer interposed in between, and causes the magnetization direction of the ferromagnetic interconnection to be oriented to the ferromagnetic pinned layer at the appropriate mutual angle (see FIG. 17). Thereby, the spin transfer torque magnetization switching probability of the ferromagnetic free layer is expected to be increased. The reason for this is as follows. When the ferromagnetic interconnection is connected to the ferromagnetic free layer with the non-magnetic layer being interposed in between and the magnetization direction of the ferromagnetic interconnection is oriented to the ferromagnetic pinned layer at the appropriate mutual angle, a spin current is generated in the non-magnetic layer. This spin current is propagated to, and thus acts on the ferromagnetic free layer, so that the precession motion of the ferromagnetic free layer is stabilized. While the precession motion is being stabilized, if a current is applied to the tunnel magnetoresistive device 402 between the non-magnetic layer 401 and the electrode 403 so that a strong spin transfer torque is generated, it is possible to reduce the critical current, and concurrently to increase the switching probability of the magnetization. FIG. 18B is an explanatory drawing showing how the precession motion of the ferromagnetic free layer is stabilized, and the current is applied to the tunnel magnetoresistive device 402 between the non-magnetic layer 401 and the electrode 403, as well as the strong spin transfer torque acts on the ferromagnetic free layer. In FIG. 18B, $m_x$ denotes the x-coordinate component of the magnetization vector of the ferromagnetic free layer shown in FIG. 18A. $I_1$ and $I_2$ denote the respective currents shown in FIGS. 15A and 15B. First of all, $I_1$ is caused to flow as shown by the middle graph in FIG. 18B. Shortly after $I_1$, $I_2$ is applied as shown by the bottom graph in FIG. 18B. The flow of $I_1$ allows $m_x$ to show a stable precession motion while vibrating with a desirable frequency as shown in FIG. 18A.

Figure 3:
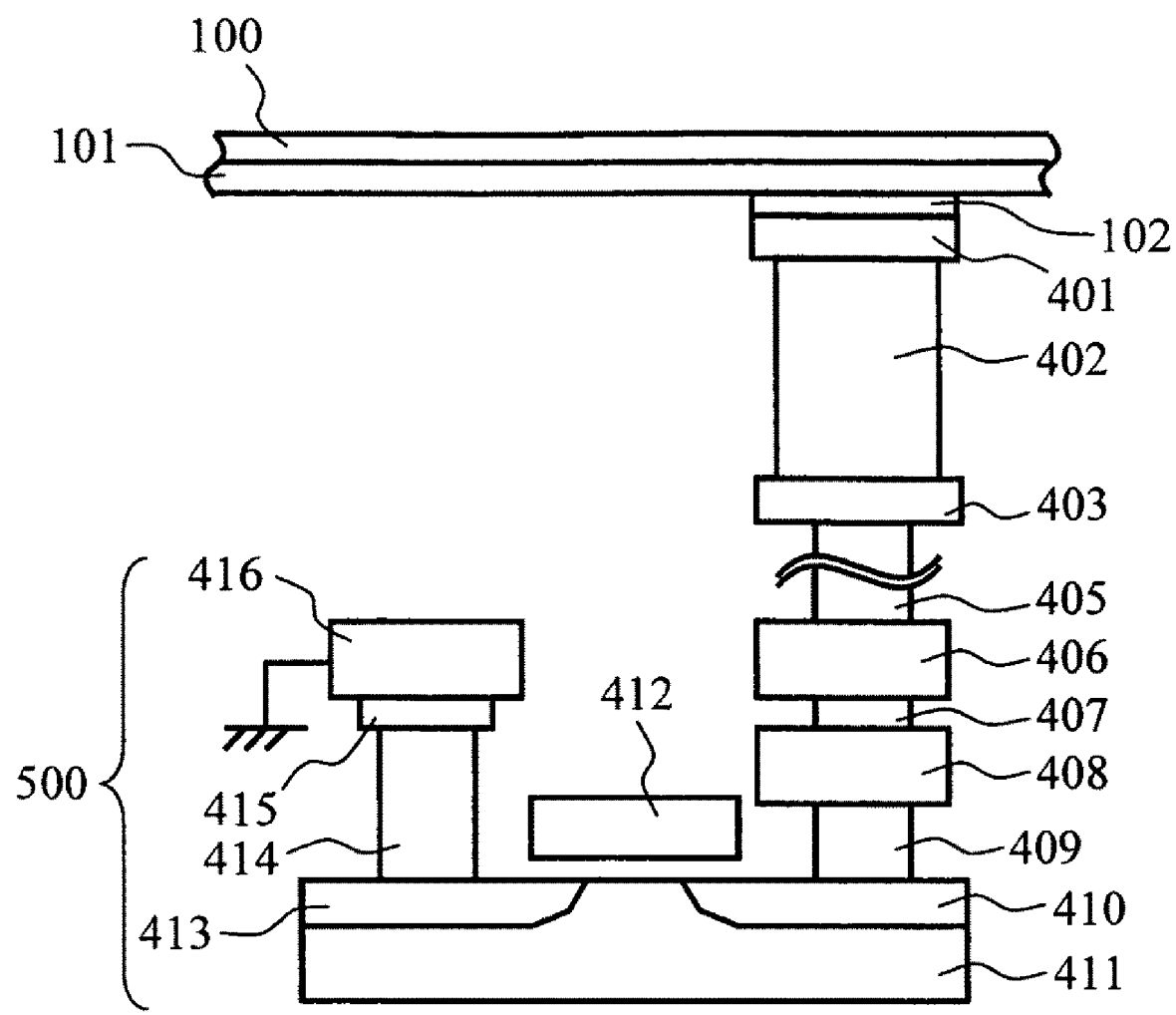
FIG. 3 is a schematic diagram showing a second configuration example of the magnetic memory cell according to the present invention.

FIG. 3 shows a second configuration example of the magnetic memory cell shown in FIG. 1 which further includes an insulating layer 102 interposed between the ferromagnetic interconnection 101 and the non-magnetic layer 401. The insulating layer 102 is capable of increasing the magnitude of the spin current injected from the ferromagnetic interconnection 101 into the non-magnetic layer 401, and of selectively injecting an efficient spin. The term "an efficient spin" herein means a spin current including a spin with a large spin polarization. A spin current with a large spin polarizability allows the precession motion of the ferromagnetic free layer 200 to be more stabilized, and accordingly reduces the critical current further. The insulating layer 102 is made of an oxide such as MgO, AlO or $SiO_2$. Instead, a semiconductor material such as GaAs or ZnSe, or a nitride such as AlN or SiN may be used for the insulating layer 102. Particularly, in a case where MgO is used for the insulating layer 102, it is desirable that CoFeB be used for the ferromagnetic interconnection 101. It is desirable that the film thickness of the insulating layer 102 be set no thicker than 3 nm so that the current injected through the insulating layer 102 can be generated as a tunnel current.

Figure 4A:
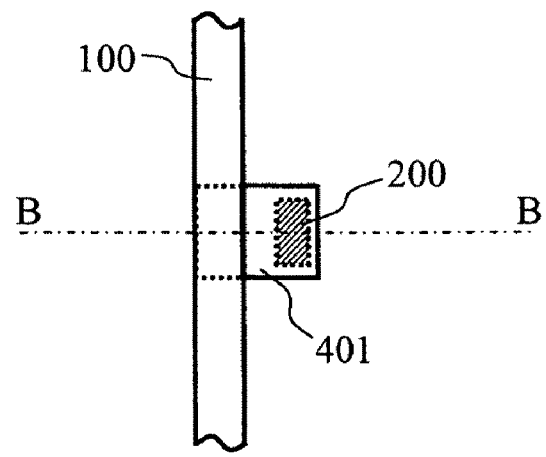
FIGS. 4A and 4B are pattern diagrams showing a chief section taken out of the magnetic memory cell shown in FIG. 3.
Figure 4B:
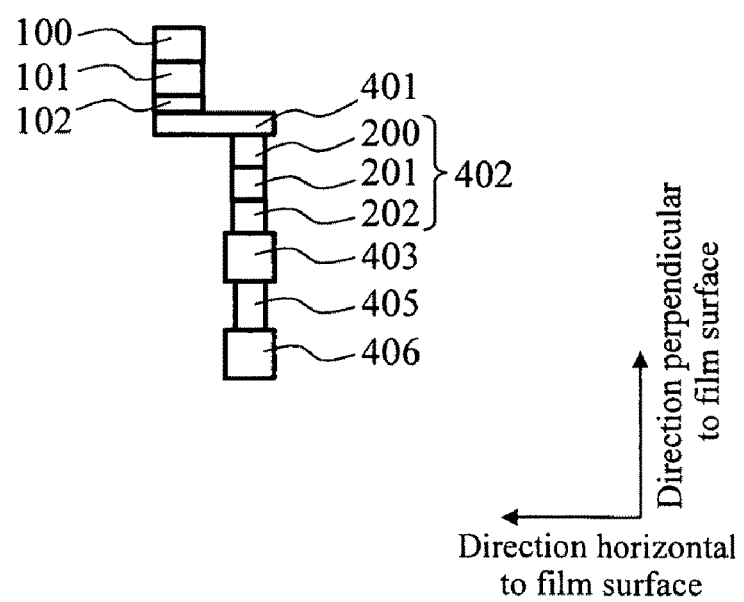

FIGS. 4A and 4B are pattern diagrams showing a chief section taken out of the magnetic memory cell shown in FIG. 3. FIG. 4A is a plan pattern diagram showing the chief section. FIG. 4B is a cross-sectional pattern diagram showing the chief section taken along the IVB-IVB line of FIG. 4A. In the illustrated examples, the tunnel magnetoresistive device 402 including the ferromagnetic pinned layer 202, the insulating barrier layer 201 and the ferromagnetic free layer 200 is stacked on the electrode 403 having the electrodes 405 and 406 thereunder. In addition, the non-magnetic layer 401 is formed on the ferromagnetic free layer 200, and the ferromagnetic interconnection 101 is connected to the non-magnetic layer 401 with the insulating layer 102 being interposed in between.

Figure 5:
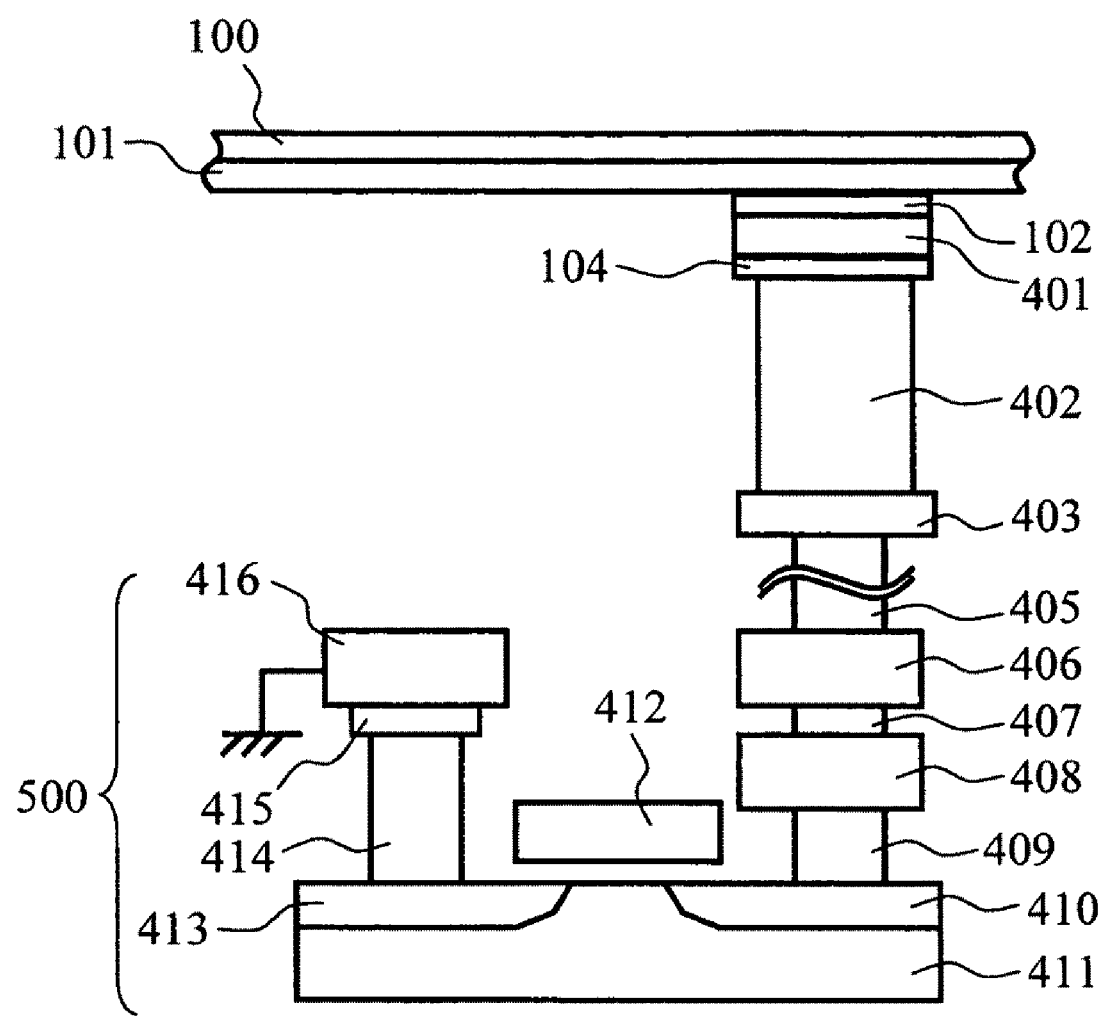
FIG. 5 is a schematic diagram showing a third configuration example of the magnetic memory cell according to the present invention.

FIG. 5 shows a third configuration example of the magnetic memory cell shown in FIG. 3 which further includes an insulating layer 104 between the ferromagnetic free layer 200 and the non-magnetic layer 401. With this configuration example, it is possible to further increase the magnitude of the spin current propagated to and acting on the ferromagnetic free layer 200, and further stabilize the precession motion of the magnetization of the ferromagnetic free layer 200, as well as further reducing the critical current. The material and film thickness of the insulating layer 104 are the same as those of the insulating layer 102.

Figure 6A:
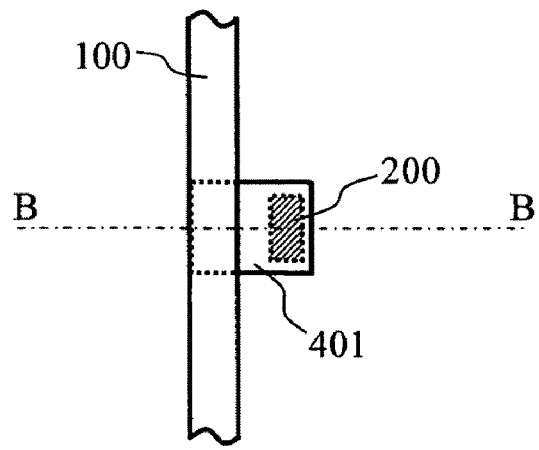
FIGS. 6A and 6B are pattern diagrams showing a chief section taken out of the magnetic memory cell shown in FIG. 5.
Figure 6B:
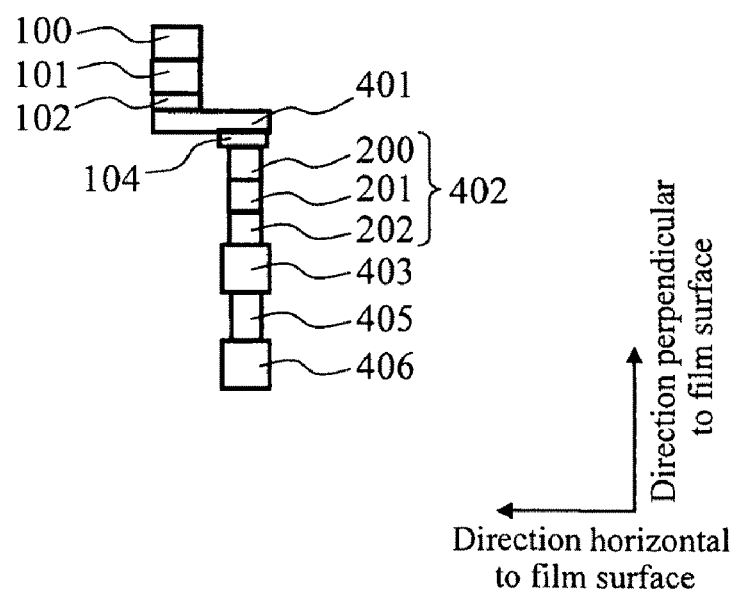

FIGS. 6A and 6B are pattern diagrams showing a chief section taken out of the magnetic memory cell shown in FIG. 5. FIG. 6A is a plan pattern diagram showing the chief section. FIG. 6B is a cross-sectional pattern diagram showing the chief section taken along the VIB-VIB line of FIG. 6A. In the illustrated examples, the tunnel magnetoresistive device 402 including the ferromagnetic pinned layer 202, the insulating barrier layer 201 and the ferromagnetic free layer 200 is stacked on the electrode 403 having the electrodes 405 and 406 thereunder. In addition, the non-magnetic layer 401 is formed on the ferromagnetic free layer 200 with the insulating layer 104 being interposed in between, and the ferromagnetic interconnection 101 is connected to the non-magnetic layer 401 with the insulating layer 102 being interposed in between.

Figure 7:
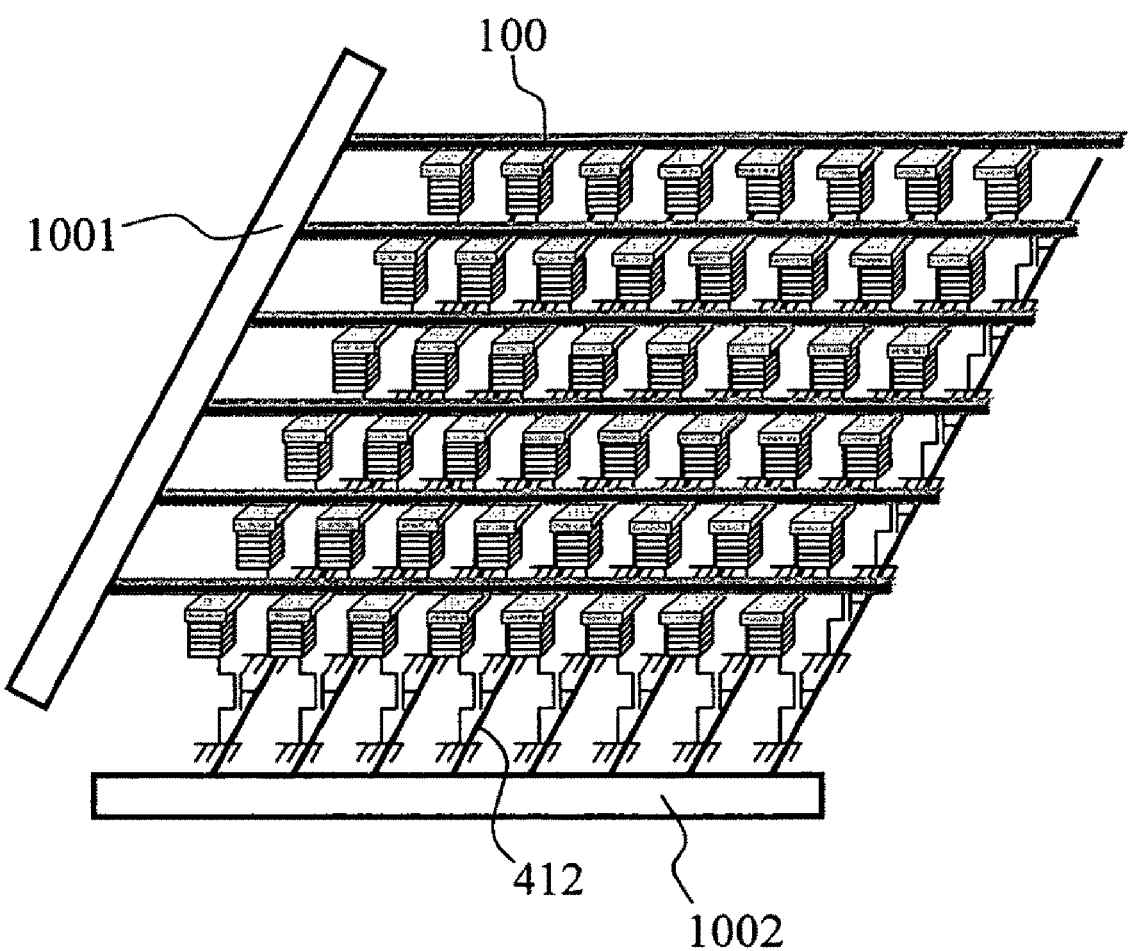
FIG. 7 is a diagram showing an example of a configuration of a magnetic random access memory according to the present invention.

FIG. 7 is a diagram showing an example of a configuration of a magnetic random access memory according to the present invention which is configured by arranging, in an array, multiple magnetic memory cells shown in any one of FIGS. 1 to 2, FIGS. 3 to 4 and FIGS. 5 to 6. It is possible to realize the magnetic random access memory having a gigabit-class capacity by fabricating each magnetic memory cell with 100 nm or less interconnection width and layer thickness. One gate electrode 412 and its corresponding bit line 100 are electrically connected to each memory cell. As a driver for controlling the bit lines 100, a bit line driver 1001 is placed in the magnetic random access memory. As a driver for controlling the gate electrodes 412, a gate driver 1002 is placed in the magnetic random access memory.

FIG. 8 is a schematic diagram showing a fourth configuration example of the magnetic memory cell according to the present invention. The magnetic memory cell of this example is the magnetic memory cell shown in FIG. 1 which further includes a non-magnetic interconnection 103 connected to the non-magnetic layer 401, and causes a current to flow between the ferromagnetic interconnection 101 and the non-magnetic interconnection 103. This configuration makes the magnetic memory cell of this example different from that shown in FIG. 1.

Figure 9A:
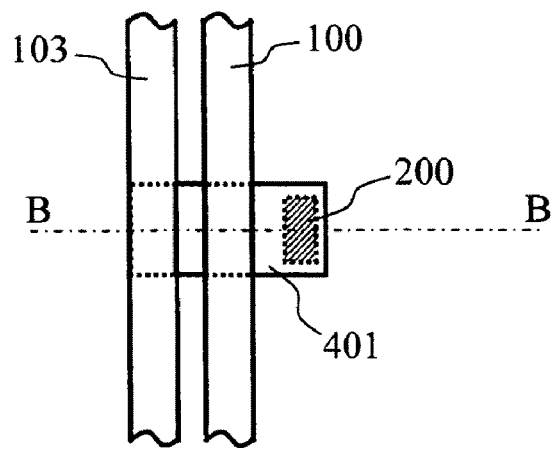
FIGS. 9A and 9B are pattern diagrams showing a chief section taken out of the magnetic memory cell shown in FIG. 8.
Figure 9B:
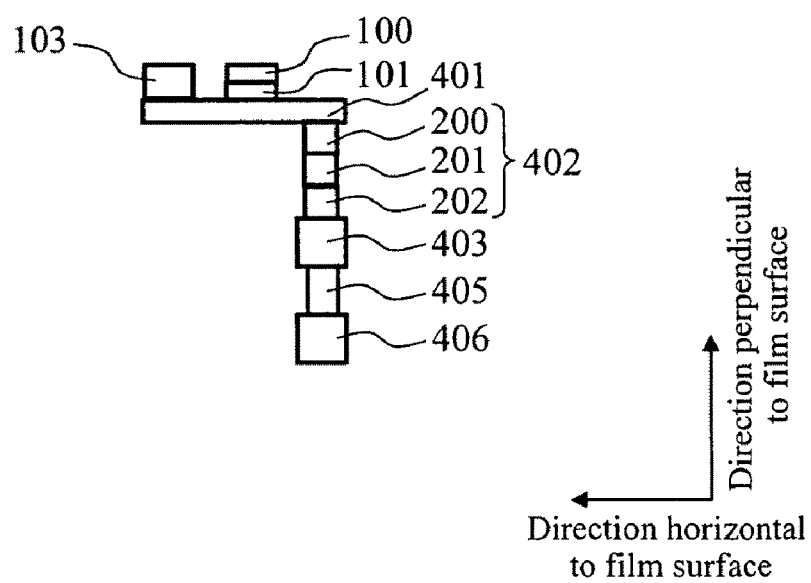

FIGS. 9A and 9B are pattern diagrams showing a chief section taken out of the magnetic memory cell shown in FIG. 8. FIG. 9A is a plan pattern diagram showing the chief section. FIG. 9B is a cross-sectional pattern diagram showing the chief section taken along the IXB-IXB line of FIG. 9A. In the case of the magnetic memory cell shown in FIGS. 9A and 9B, the tunnel magnetoresistive device 402 including the ferromagnetic pinned layer 202, the insulating barrier layer 201 and the ferromagnetic free layer 200 is stacked on the electrode 403 having the electrodes 405 and 406 thereunder. In addition, the non-magnetic layer 401 is formed on the ferromagnetic free layer 200, and the ferromagnetic interconnection 101 is connected to the non-magnetic layer 401. Furthermore, the non-magnetic interconnection 103 is connected to the non-magnetic layer 401 in separation from the ferromagnetic interconnection 101.

Figure 10:
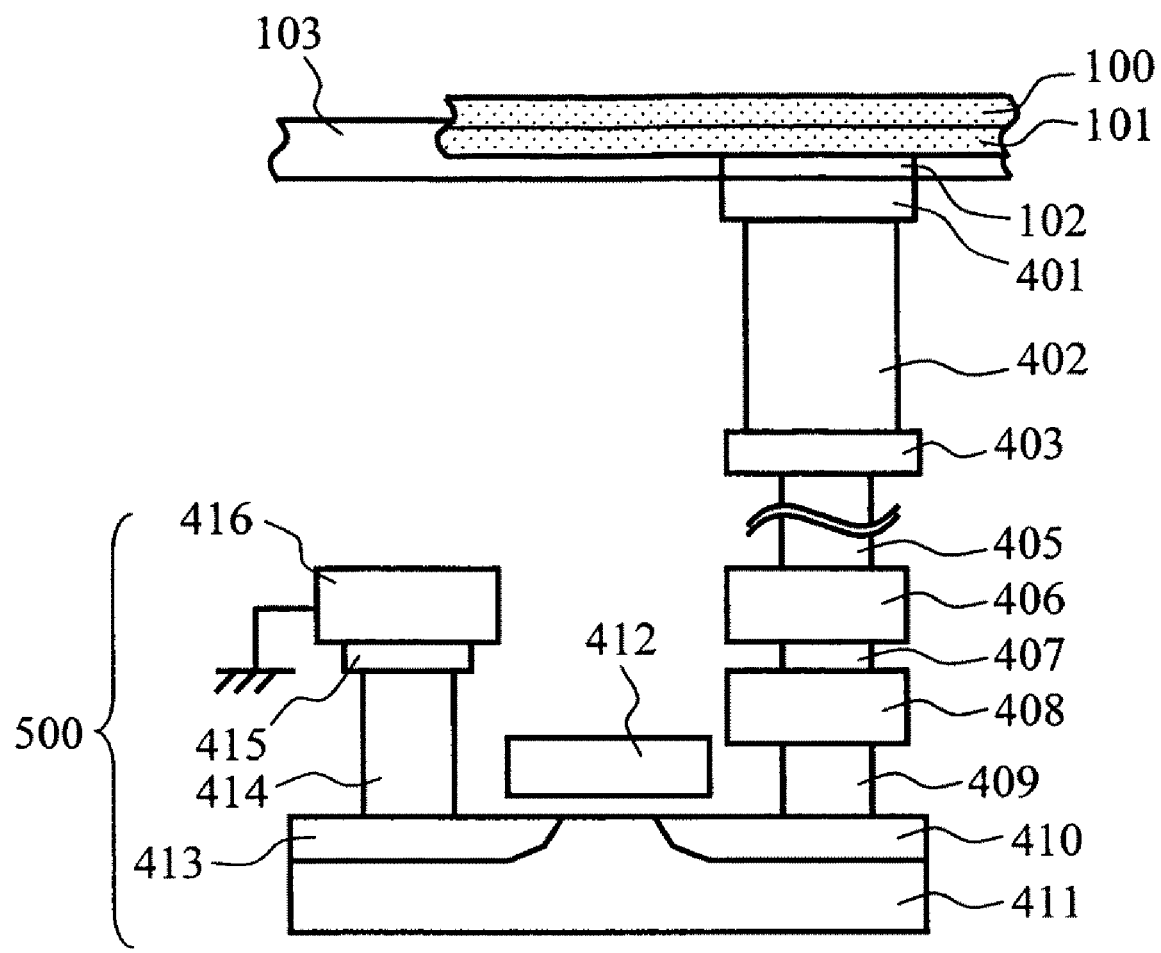
FIG. 10 is a schematic diagram showing a fifth configuration example of the magnetic memory cell according to the present invention.

FIG. 10 shows a configuration of the magnetic memory cell shown in FIG. 8 in which the ferromagnetic interconnection 101 is connected to the non-magnetic layer 401 with the newly-provided insulating layer 102 being interposed in between.

Figure 11A:
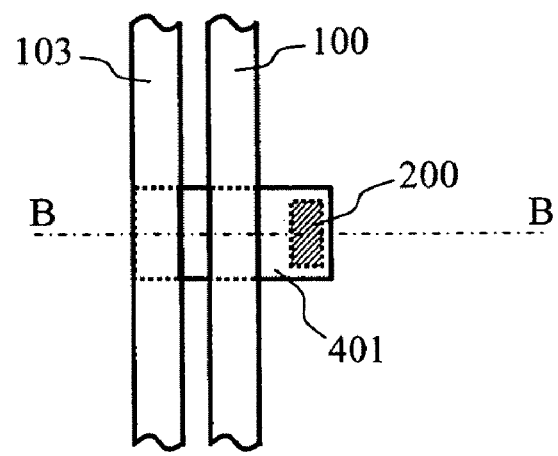
FIGS. 11A and 11B are pattern diagrams showing a chief section taken out of the magnetic memory cell shown in FIG. 10.
Figure 11B:
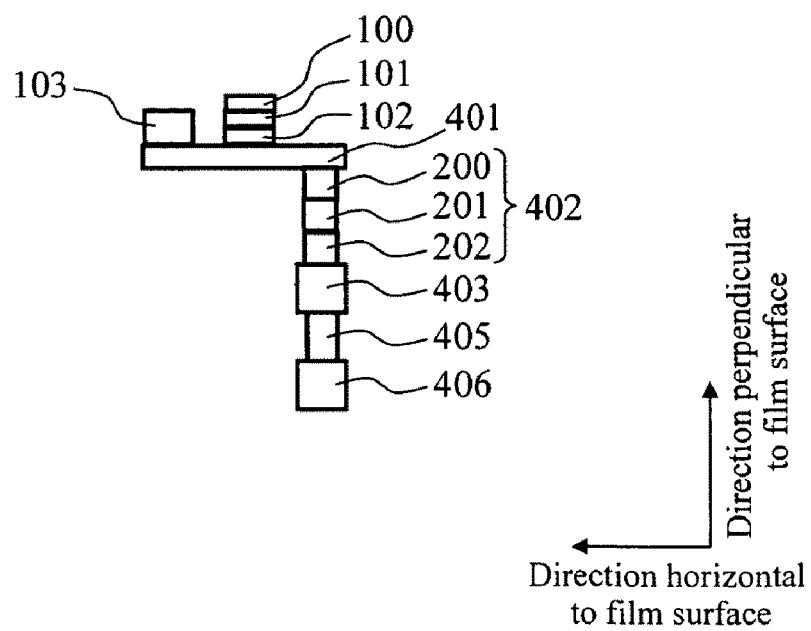

FIGS. 11A and 11B are pattern diagrams showing a chief section taken out of the magnetic memory cell shown in FIG. 10. FIG. 11A is a plan pattern diagram showing the chief section. FIG. 11B is a cross-sectional pattern diagram showing the chief section taken along the XIB-XIB line of FIG. 11A. In the illustrated examples, the tunnel magnetoresistive device 402 including the ferromagnetic pinned layer 202, the insulating barrier layer 201 and the ferromagnetic free layer 200 is stacked on the electrode 403 having the electrodes 405 and 406. In addition, the non-magnetic layer 401 is formed on the ferromagnetic free layer 200, and the ferromagnetic interconnection 101 is connected to the non-magnetic layer 401 with the insulating layer 102 being interposed in between.

Furthermore, the non-magnetic interconnection 103 is connected to the non-magnetic layer 401 in separation from the ferromagnetic interconnection 101. A material such as Cu or Al which has small electrical resistance and large process durability can be used for the non-magnetic interconnection 103.

Figure 12:
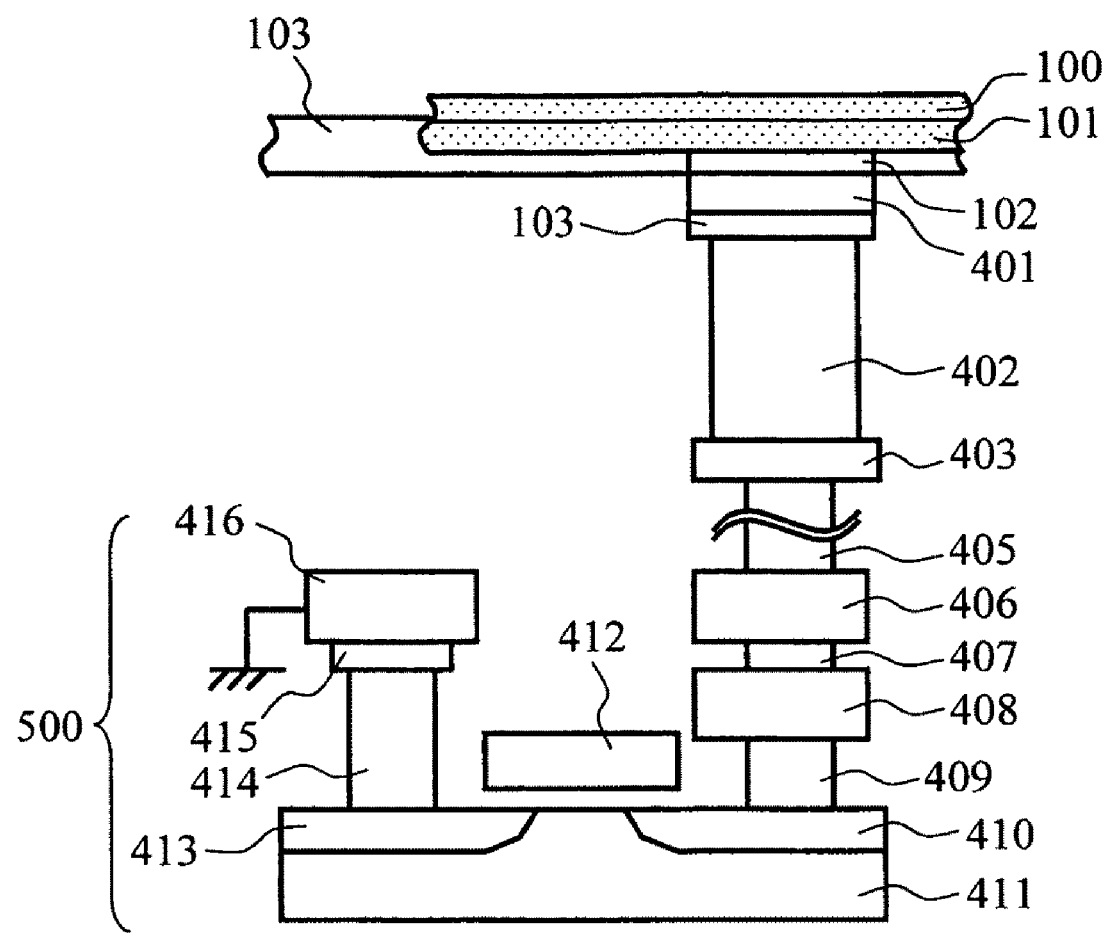
FIG. 12 is a schematic diagram showing a 6th configuration example of the magnetic memory cell according to the present invention.

FIG. 12 shows a configuration of the magnetic memory cell shown in FIG. 10 in which the insulating layer 103 is newly provided between the non-magnetic layer 401 and the ferromagnetic free layer 200.

Figure 13A:
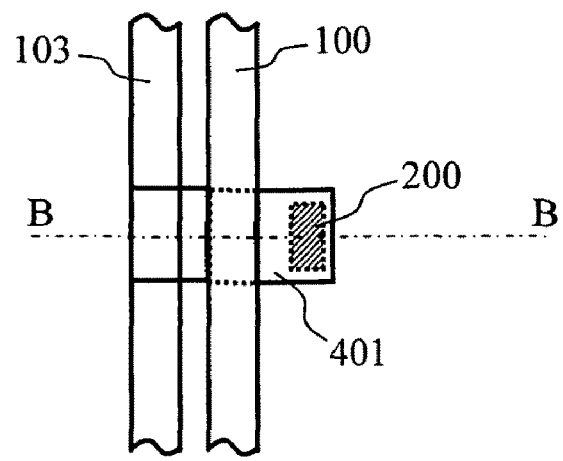
FIGS. 13A and 13B are pattern diagrams showing a chief section taken out of the magnetic memory cell shown in FIG. 12.
Figure 13B:
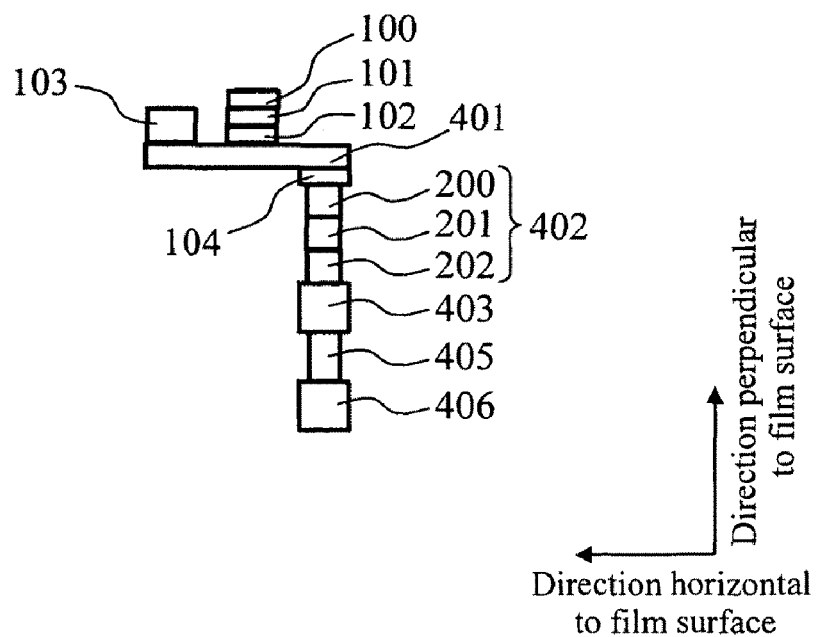

FIGS. 13A and 13B are pattern diagrams showing a chief section taken out of the magnetic memory cell shown in FIG. 12. FIG. 13A is a plan pattern diagram showing the chief section. FIG. 13B is a cross-sectional pattern diagram showing the chief section taken along the XIIIB-XIIIB line of FIG. 13A. In the illustrated examples, the tunnel magnetoresistive device 402 including the ferromagnetic pinned layer 202, the insulating barrier layer 201 and the ferromagnetic free layer 200 is stacked on the electrode 403 having the electrodes 405 and 406 thereunder. In addition, the non-magnetic layer 401 is formed on the ferromagnetic free layer 200 with the insulating layer 103 being interposed in between, and the ferromagnetic interconnection 101 is connected to the non-magnetic layer 401 with the insulating layer 102 being interposed in between. Furthermore, the non-magnetic interconnection 103 is connected to the non-magnetic layer 401 in separation from the ferromagnetic interconnection 101.

Figure 14:
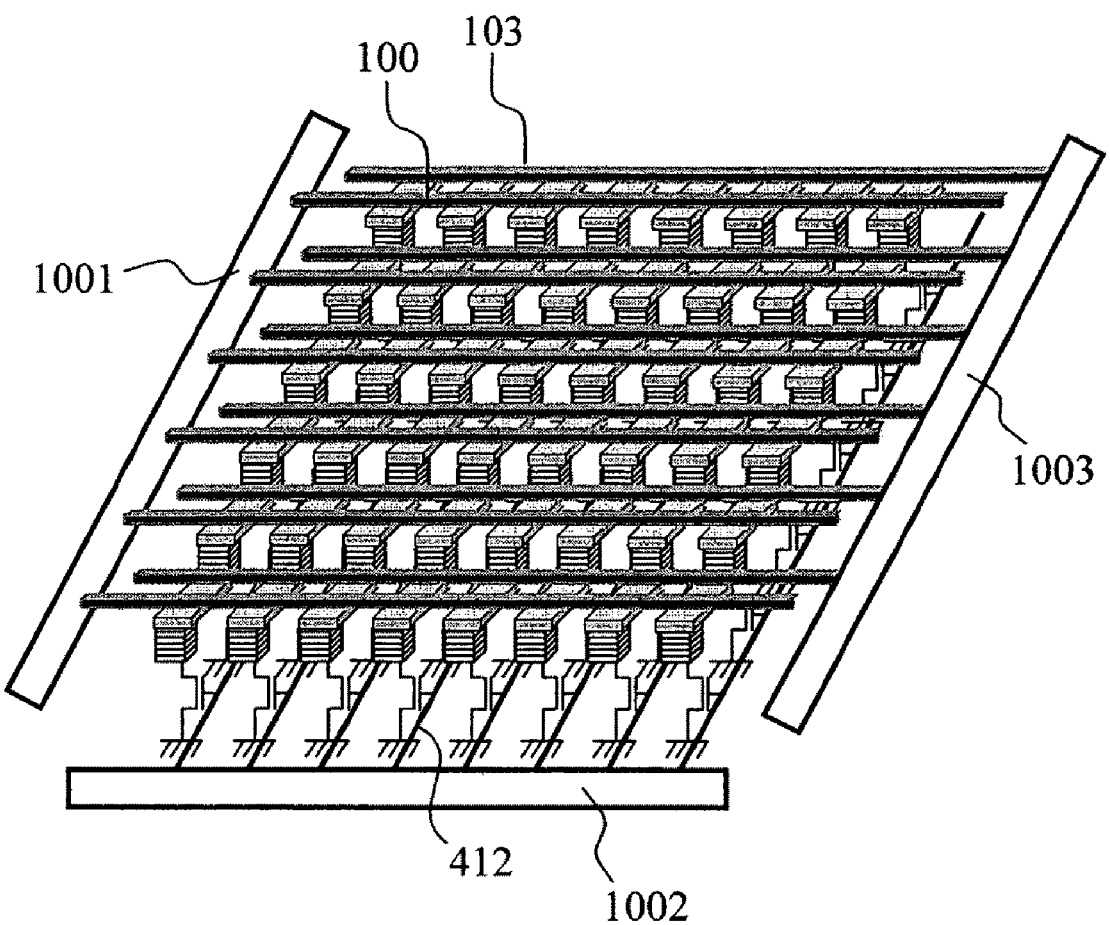
FIG. 14 is a diagram showing an example of a configuration of another magnetic random access memory according to the present invention.

FIG. 14 is a diagram showing an example of a configuration of another magnetic random access memory according to the present invention which is configured by arranging, in an array, multiple magnetic memory cells shown in any one of FIGS. 8 to 9, FIGS. 10 to 11 and FIGS. 12 to 13. It is possible to realize the magnetic random access memory having a gigabits-class capacity by fabricating each magnetic memory cell with 100 nm or less interconnection width and layer thickness. One gate electrode 412 and its corresponding bit line 100 are electrically connected to each memory cell. As a driver for controlling the bit lines 100, a bit line driver 1001 is placed in the magnetic random access memory. As a driver for controlling the gate electrodes 412, a gate driver 1002 is placed in the magnetic random access memory. The magnetic random access memory according to this example further includes a driver 1003 for controlling the non-magnetic interconnections 103.

Now, by referring to FIGS. 15A to 15C and 16A to 16C, descriptions will be provided for an example of how the write currents are controlled in the magnetic memory cell shown in any one of FIGS. 8 to 9, FIGS. 10 to 11 and FIGS. 12 to 13 as well as the magnetic random access memory shown in FIG. 14. In the case below, the ferromagnetic free layer 200 is configured of a single-layered ferromagnetic layer.

Firstly, by referring to FIG. 15A, descriptions will be provided for a case in which the magnetization directions of the ferromagnetic free layer 200 and the ferromagnetic pinned layer 202 are switched from being parallel to antiparallel to each other. The magnetization direction of the ferromagnetic interconnection 101 is antiparallel to the magnetization of the ferromagnetic pinned layer 202. In other words, it is when $\theta_1$ is equal to 0°. $I_1$ denotes a current flowing from the ferromagnetic interconnection 101 to the non-magnetic interconnection 103 through the non-magnetic layer 401. The current $I_1$ is controlled by driving the bit line driver 1001 and the driver 1003. $I_2$ denotes a current flowing from the ferromagnetic interconnection 101 to the tunnel magnetoresistive device 402 through the non-magnetic layer 401. Alternatively, the current $I_2$ may be caused to flow from the non-magnetic interconnection 103 to the tunnel magnetoresistive device 402 through the non-magnetic layer 401. What is important is that the current $I_2$ flows into the tunnel magnetoresistive device 402 independently of and separately from the current $I_1$. In this way, the current $I_2$ acts as a current causing the spin transfer torque magnetization switching of the ferromagnetic free layer 200. The current $I_2$ is controlled by adjusting a relationship among the voltages respectively of the gate driver 1002, the bit line driver 1001 and the driver 1003.

FIGS. 15B and 15C respectively show examples of timings at which the currents $I_1$ and $I_2$ are applied. At first, descriptions will be provided for a case shown in FIG. 15B. The current $I_1$ which is not larger than a critical current causing the magnetization switching of the ferromagnetic free layer 200 by the spin transfer torque is imparted. Immediately after this, the current $I_2$ is caused to flow. With regard to the timing to apply the current $I_2$, it is desirable that the current $I_2$ should be applied within 1 nanosecond after the current $I_1$ is applied. The preceding application of the current $I_1$ generates a difference between the voltages of the bit line driver 1001 and the driver 1003, thus generating a current in a direction indicated by an arrow 603 of FIG. 15A. The opening of the gate driver 1002 generates a current path (indicated by an arrow 604) for the current $I_2$ to the tunnel magnetoresistive device 402.

Figure 16A:
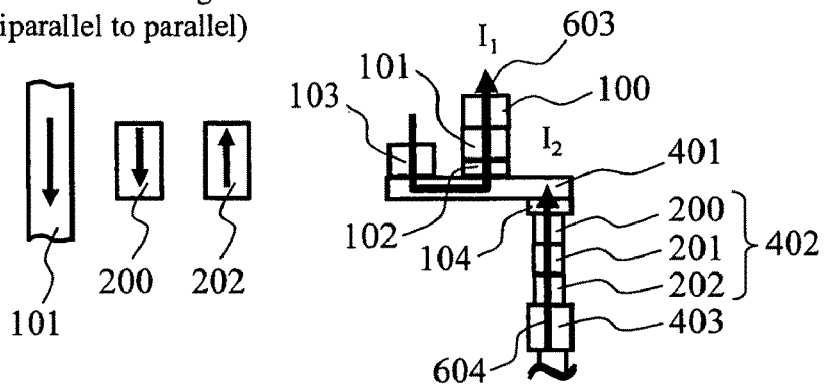
FIGS. 16A, 16B and 16C are diagrams showing another relationship between the write currents and the respective write timings.
Figure 16B:
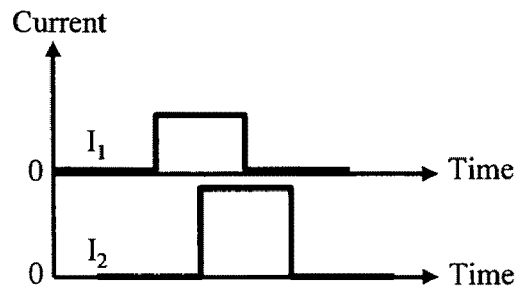
Figure 16C:
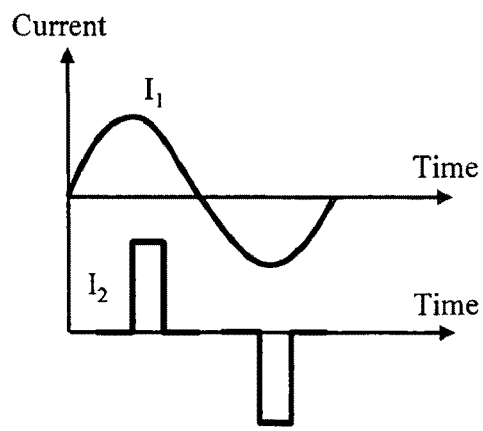

FIG. 15C shows another example of the timings at which the currents $I_1$ and $I_2$ are applied. In this case, as an alternating current, the current $I_1$ having an amplitude corresponding to a current which is not larger than a critical current causing the magnetization switching of the ferromagnetic free layer 200 by the spin transfer torque, is constantly imparted. The current $I_2$ is caused to flow at an appropriate time when the spin transfer torque magnetization switching of the ferromagnetic free layer 200 is executed. It is desirable that the frequency of the alternating current be equal to 1 GHz or higher. Particularly, it is desirable that the timing at which the current $I_2$ is caused to flow be a time when the amplitude of the current $I_1$ becomes the largest. FIGS. 16A, 16B and 16C show how the write currents are controlled when the magnetization directions of the ferromagnetic free layer 200 the ferromagnetic pinned layer 202 are switched from being antiparallel to being parallel to each other. The write currents are similarly controlled by setting the directions of the currents $I_1$ and $I_2$ opposite to those of the currents $I_1$ and $I_2$ shown in FIG. 15A.

FIG. 19 is a table showing examples of the materials for the ferromagnetic free layer 200 and the ferromagnetic pinned layer 202 used in the magnetic memory cell according to the present invention. A single layer made of a magnetic material such as CoFeB, CoFe, CoB, CoFe, Co, Fe or NiFe may be used as each of the ferromagnetic free layer 200 and the ferromagnetic pinned layer 202. Alternatively, three layers including a first ferromagnetic layer 210, a second ferromagnetic layer 211 and an intermediary layer 214 may be used for the ferromagnetic free layer 200 whereas three layers including a third ferromagnetic layer 213, a fourth ferromagnetic layer 213 and the intermediary layer 214 may be used for the ferromagnetic pinned layer 202. In this respect, materials respectively for the first ferromagnetic layer 210, the second ferromagnetic layer 211, the third ferromagnetic layer 212 and the fourth ferromagnetic layer 213 should be selected from material combinations shown in FIG. 19. The intermediary layer 214 is made of Ru or the like, and is antiparallelly coupled with each of the first ferromagnetic layer 210, the second ferromagnetic layer 211, the third ferromagnetic layer 213 and the fourth ferromagnetic layer 213. In addition, a material such as magnesium oxide, aluminum oxide or silicon magnesium may be used for the insulating barrier layer 201.

According to the present invention, it is possible to realize the reliable nonvolatile memory with a lower power consumption. The present invention is capable of reducing the critical current density of the memory according to the present invention to one fifth of that of a memory including a conventional type of structure, and concurrently capable of reducing the write error rate of the memory according to the present invention to one tenth of that of the memory including the conventional type of structure. Furthermore, the present invention is capable of realizing a high density magnetic memory with the gigabit-class capacity.

EXPLANATION OF REFERENCE NUMERALS

101 . . . ferromagnetic interconnection, 102 . . . insulating layer, 103 . . . non-magnetic interconnection, 104 . . . insulating layer, 200 . . . ferromagnetic free layer, 201 . . . insulating layer, 202 . . . ferromagnetic pinned layer, 401 . . . non-magnetic layer, 402 . . . magnetoresistive device, 403-408 . . . electrode, 409 . . . source electrode, 412 . . . gate electrode, 414 . . . drain electrode, 500 . . . transistor, 1001 . . . bit line driver, 1002 . . . gate driver, 1003 . . . current control driver, 210 . . . ferromagnetic free layer, 211 . . . ferromagnetic pinned layer, 212 . . . ferromagnetic pinned layer, 213 . . . ferromagnetic pinned layer, 214 . . . intermediary layer

What is claimed is:

1. A magnetic memory cell comprising:
    a magnetoresistive device including a first non-magnetic film, a ferromagnetic free layer and a ferromagnetic pinned layer, the ferromagnetic free layer and the ferromagnetic pinned layer being formed with the first non-magnetic film interposed in between;
    an electrode for causing a current to flow in the magnetoresistive device in its thickness direction;
    a non-magnetic layer formed on and connected to the ferromagnetic free layer; and
    a ferromagnetic interconnection connected to the non-magnetic layer and formed on the non-magnetic layer at a position that is laterally offset from the magnetoresistive device,
    wherein information is written in the magnetic memory cell by causing the a current to flow in the magnetoresistive device so that a spin transfer torque switches a magnetization of the ferromagnetic free layer, and
    a magnetization direction of the ferromagnetic interconnection is antiparallel to a magnetization direction of the ferromagnetic pinned layer.

2. The magnetic memory cell according to claim 1, wherein a current is caused to flow in the magnetoresistive device through the ferromagnetic interconnection.

3. The magnetic memory cell according to claim 1, further comprising:
    a non-magnetic interconnection connected to the non-magnetic layer; and
    means for causing a current to flow between the non-magnetic interconnection and the ferromagnetic interconnection.

4. The magnetic memory cell according to claim 1, wherein the ferromagnetic free layer is configured of a single-layered ferromagnetic film.

5. The magnetic memory cell according to claim 1, wherein the ferromagnetic free layer is a laminated film having a synthetic ferrimagnetic structure, and
    a magnetization direction of the ferromagnetic interconnection is parallel to a magnetization direction of the ferromagnetic pinned layer.

6. The magnetic memory cell according to claim 1, wherein the first non-magnetic film is an insulating film.

7. The magnetic memory cell according to claim 1, wherein the ferromagnetic interconnection is connected to the non-magnetic layer with an insulating film interposed in between.

8. The magnetic memory cell according to claim 1, wherein the ferromagnetic free layer is connected to the non-magnetic layer with a first insulating film interposed in between, and
    the ferromagnetic interconnection is connected to the non-magnetic layer with a second insulating film interposed in between.

9. The magnetic memory cell according to claim 1,
    further comprising a switching element for controlling the ON/OFF of the current flowing to the magnetoresistive device.

* * * * *